(12) United States Patent
Tang et al.

(10) Patent No.: US 11,062,906 B2
(45) Date of Patent: Jul. 13, 2021

(54) SILICON IMPLANTATION IN SUBSTRATES AND PROVISION OF SILICON PRECURSOR COMPOSITIONS THEREFOR

(71) Applicant: Entegris, Inc., Billerica, MA (US)

(72) Inventors: Ying Tang, Brookfield, CT (US); Joseph D. Sweeney, New Milford, CT (US); Tianniu Chen, Westford, MA (US); James J. Mayer, Fischer, TX (US); Richard S. Ray, Phoenix, AZ (US); Oleg Byl, Southbury, CT (US); Sharad N. Yedave, Danbury, CT (US); Robert Kaim, Brookline, MA (US)

(73) Assignee: Entegris, Inc., Billerica, MA (US)

( * ) Notice: Subject to any disclaimer, the term of this patent is extended or adjusted under 35 U.S.C. 154(b) by 391 days.

(21) Appl. No.: 14/912,380

(22) PCT Filed: Aug. 14, 2014

(86) PCT No.: PCT/US2014/051162
§ 371 (c)(1),
(2) Date: Feb. 16, 2016

(87) PCT Pub. No.: WO2015/023903
PCT Pub. Date: Feb. 19, 2015

(65) Prior Publication Data
US 2016/0211137 A1    Jul. 21, 2016

Related U.S. Application Data

(60) Provisional application No. 61/866,918, filed on Aug. 16, 2013.

(51) Int. Cl.
| | |
|---|---|
| *H01L 21/265* | (2006.01) |
| *H01J 37/317* | (2006.01) |
| *H01J 37/32* | (2006.01) |

(52) U.S. Cl.
CPC ........ *H01L 21/265* (2013.01); *H01J 37/3171* (2013.01); *H01J 37/32412* (2013.01);
(Continued)

(58) Field of Classification Search
CPC ......... H01L 21/26506; H01L 21/26513; H01L 21/265; H01L 21/26546; H01J 37/3171;
(Continued)

(56) References Cited

U.S. PATENT DOCUMENTS

| | | | |
|---|---|---|---|
| 4,331,647 A | 5/1982 | Goldenberg | |
| 4,348,376 A | 9/1982 | Goldenberg | |

(Continued)

FOREIGN PATENT DOCUMENTS

| | | |
|---|---|---|
| CN | 101681782 A | 3/2010 |
| EP | 0079705 A1 | 5/1983 |

(Continued)

OTHER PUBLICATIONS

Advanced Technology Materials, Inc., "VAC GeF4 Isotopically Enriched: Materials: VAC Delivery Package Germanium Tetrafluoride", 2005, pp. 12 (Best Available Copy), Published in: Danbury, CT.

(Continued)

*Primary Examiner* — Syed I Gheyas
(74) *Attorney, Agent, or Firm* — Entegris, Inc.

(57) ABSTRACT

Compositions, systems, and methods are described for implanting silicon and/or silicon ions in a substrate, involving generation of silicon and/or silicon ions from corresponding silicon precursor compositions, and implantation of the silicon and/or silicon ions in the substrate.

7 Claims, 3 Drawing Sheets

(52) U.S. Cl.
CPC ..... *H01J 2237/006* (2013.01); *H01J 2237/08* (2013.01); *H01L 21/26506* (2013.01); *H01L 21/26546* (2013.01)

(58) Field of Classification Search
CPC ............. H01J 2237/006; H01J 2237/08; H01J 37/32412
See application file for complete search history.

(56) References Cited

U.S. PATENT DOCUMENTS

| | | |
|---|---|---|
| 4,657,774 A | 4/1987 | Satou et al. |
| 4,658,143 A | 4/1987 | Tokiguchi et al. |
| 4,680,358 A | 7/1987 | Yu |
| 4,722,978 A | 2/1988 | Yu |
| 4,803,292 A | 2/1989 | Ohfune et al. |
| 4,847,504 A | 7/1989 | Aitken |
| 4,851,255 A | 7/1989 | Lagendijk et al. |
| 4,942,246 A | 7/1990 | Tanaka et al. |
| 5,061,322 A | 10/1991 | Asano |
| 5,899,733 A | 5/1999 | Gisdakis et al. |
| 5,940,724 A | 8/1999 | Warren |
| 5,943,594 A | 8/1999 | Bailey et al. |
| 5,962,858 A | 10/1999 | Gwinn |
| 5,977,552 A | 11/1999 | Foad |
| 5,993,766 A | 11/1999 | Tom et al. |
| 6,086,837 A | 7/2000 | Cowan et al. |
| 6,096,467 A | 8/2000 | Shimizu et al. |
| 6,135,128 A | 10/2000 | Graf et al. |
| 6,146,601 A | 11/2000 | Abesadze et al. |
| 6,215,125 B1 | 4/2001 | Chen et al. |
| 6,376,664 B1 | 4/2002 | Chan et al. |
| 6,420,304 B1 | 7/2002 | Tsai et al. |
| 6,486,227 B2 | 11/2002 | Nohr et al. |
| 6,559,462 B1 | 5/2003 | Carpenter et al. |
| 6,600,092 B2 | 7/2003 | Lee |
| 6,730,568 B2 | 5/2004 | Sohn |
| 6,756,600 B2 | 6/2004 | Ng et al. |
| 6,780,896 B2 | 8/2004 | MacDonald et al. |
| 6,852,610 B2 | 2/2005 | Noda |
| 6,872,639 B2 | 3/2005 | DeBoer et al. |
| 6,893,907 B2 | 5/2005 | Maydan et al. |
| 6,905,947 B2 | 6/2005 | Goldberg |
| 7,094,670 B2 | 8/2006 | Collins et al. |
| 7,138,768 B2 | 11/2006 | Maciejowski et al. |
| 7,144,809 B2 | 12/2006 | Elers et al. |
| 7,397,048 B2 | 7/2008 | Singh et al. |
| 7,404,845 B2 | 7/2008 | Temple et al. |
| 7,473,606 B2 | 1/2009 | Hsiao et al. |
| 7,491,947 B2 | 2/2009 | Cobb et al. |
| 7,563,308 B2 | 7/2009 | Tempel et al. |
| 7,586,109 B2 | 9/2009 | Perel et al. |
| 7,641,879 B2 | 1/2010 | Spielvogel et al. |
| 7,655,931 B2 | 2/2010 | Gupta |
| 7,666,770 B2 | 2/2010 | Sasaki et al. |
| 7,759,657 B2 | 7/2010 | Tieger et al. |
| 7,825,016 B2 | 11/2010 | Giles |
| 7,833,886 B2 | 11/2010 | Giles et al. |
| 7,919,402 B2 | 4/2011 | Jacobson et al. |
| 7,947,582 B2 | 5/2011 | Hautala et al. |
| 7,966,879 B2 | 6/2011 | Dietz et al. |
| 8,013,312 B2 | 9/2011 | Adams |
| 8,062,965 B2 | 11/2011 | Kaim et al. |
| 8,187,971 B2 | 5/2012 | Russell et al. |
| 8,202,446 B2 | 6/2012 | Tempel et al. |
| 8,237,134 B2 | 8/2012 | Kaim et al. |
| 8,237,136 B2 | 8/2012 | Hautala et al. |
| 8,252,651 B2 | 8/2012 | Kawasaki |
| 8,399,865 B2 | 3/2013 | Kaim et al. |
| 8,555,705 B2 | 10/2013 | Dietz et al. |
| 8,779,383 B2 | 7/2014 | Mayer et al. |
| 8,785,889 B2 | 7/2014 | Kaim et al. |
| 2002/0000523 A1 | 1/2002 | Ng et al. |
| 2002/0014407 A1 | 2/2002 | Allen et al. |
| 2003/0023118 A1 | 1/2003 | Kanayama et al. |
| 2003/0122089 A1 | 7/2003 | Murrell et al. |
| 2003/0203608 A1 | 10/2003 | Deboer et al. |
| 2003/0216014 A1 | 11/2003 | Goldberg |
| 2004/0002202 A1 | 1/2004 | Horsky et al. |
| 2004/0110351 A1 | 6/2004 | Narasimha |
| 2004/0166612 A1 | 8/2004 | Maydan et al. |
| 2004/0235280 A1 | 11/2004 | Keys et al. |
| 2004/0241460 A1 | 12/2004 | Bedell et al. |
| 2005/0163693 A1 | 7/2005 | Spielvogel et al. |
| 2005/0191816 A1 | 9/2005 | Vanderpool et al. |
| 2005/0202657 A1 | 9/2005 | Borland et al. |
| 2005/0260354 A1 | 11/2005 | Singh et al. |
| 2005/0277246 A1 | 12/2005 | Kirkpatrick et al. |
| 2005/0287786 A1 | 12/2005 | Gammel et al. |
| 2006/0097193 A1 | 5/2006 | Horsky et al. |
| 2006/0102464 A1 | 5/2006 | Tillotson |
| 2006/0104851 A1 | 5/2006 | Tillotson |
| 2006/0264051 A1 | 11/2006 | Thibaut |
| 2007/0059848 A1 | 3/2007 | Sasaki et al. |
| 2007/0148888 A1 | 6/2007 | Krull et al. |
| 2007/0178679 A1 | 8/2007 | Hatem et al. |
| 2007/0243700 A1 | 10/2007 | Qin et al. |
| 2008/0149929 A1 | 6/2008 | Giles |
| 2008/0179545 A1 | 7/2008 | Perel et al. |
| 2008/0237496 A1 | 10/2008 | Gupta |
| 2008/0242066 A1 | 10/2008 | Jacobson et al. |
| 2008/0248636 A1 | 10/2008 | Olander et al. |
| 2008/0305598 A1 | 12/2008 | Horsky et al. |
| 2009/0200643 A1 | 8/2009 | Miki et al. |
| 2009/0252887 A1 | 10/2009 | Barker et al. |
| 2009/0294698 A1 | 12/2009 | Ray |
| 2010/0024841 A1 | 2/2010 | Koo et al. |
| 2010/0112795 A1 | 5/2010 | Kaim et al. |
| 2010/0176306 A1 | 7/2010 | Lin et al. |
| 2010/0224264 A1 | 9/2010 | Homan et al. |
| 2011/0065268 A1 | 3/2011 | Olander et al. |
| 2011/0079241 A1 | 4/2011 | Sinha et al. |
| 2011/0092058 A1 | 4/2011 | Del Agua Borniquel et al. |
| 2011/0097882 A1 | 4/2011 | Kaim et al. |
| 2011/0143527 A1 | 6/2011 | Platow et al. |
| 2011/0165053 A1 | 7/2011 | Cook et al. |
| 2012/0108044 A1 | 5/2012 | Kaim et al. |
| 2012/0119113 A1 | 5/2012 | Colvin et al. |
| 2012/0142174 A1 | 6/2012 | Kaim et al. |
| 2012/0235058 A1 | 9/2012 | Sinha et al. |
| 2012/0252195 A1 | 10/2012 | Jones et al. |
| 2013/0206788 A1 | 8/2013 | Kaim et al. |
| 2014/0061501 A1* | 3/2014 | Sinha ................. H01J 37/08 250/424 |
| 2014/0322903 A1 | 10/2014 | Mayer et al. |
| 2014/0326896 A1 | 11/2014 | Kaim et al. |
| 2015/0228486 A1 | 8/2015 | Kaim et al. |
| 2016/0046849 A1 | 2/2016 | Mayer et al. |

FOREIGN PATENT DOCUMENTS

| | | |
|---|---|---|
| EP | 0656668 B1 | 3/1999 |
| EP | 2 796 590 A1 | 10/2014 |
| JP | 58-8071 A | 1/1983 |
| JP | 62095820 A | 5/1987 |
| JP | 63-15228 A | 1/1988 |
| JP | 64-83147 A | 3/1989 |
| JP | 1-225117 A | 9/1989 |
| JP | 3165443 A | 7/1991 |
| JP | H05128984 A | 5/1993 |
| JP | 5-254808 A | 10/1993 |
| JP | 6-80681 A | 3/1994 |
| JP | 7065761 A | 3/1995 |
| JP | 7-90201 A | 4/1995 |
| JP | 8288233 A | 11/1996 |
| JP | 10-251592 A | 9/1998 |
| JP | 2001-332509 A | 11/2001 |
| JP | 2008091426 A | 4/2008 |
| JP | 2009-065136 A2 | 3/2009 |
| JP | 2013-545217 A | 12/2013 |
| KR | 10-2006-0077942 A | 7/2006 |
| TW | 200611311 A | 4/2006 |
| TW | 200616104 A | 5/2006 |
| TW | 200711720 A | 4/2007 |

(56) References Cited

FOREIGN PATENT DOCUMENTS

| WO | 9811764 A1 | 3/1998 |
|---|---|---|
| WO | 03057667 A2 | 7/2003 |
| WO | 03100806 A1 | 12/2003 |
| WO | 2004003973 A2 | 1/2004 |
| WO | 2004053945 A2 | 6/2004 |
| WO | 2005020306 A1 | 3/2005 |
| WO | 2005027208 A1 | 3/2005 |
| WO | 2005059942 A2 | 6/2005 |
| WO | 2006095086 A2 | 9/2006 |
| WO | 2007134183 A2 | 11/2007 |
| WO | 2008121549 A1 | 10/2008 |
| WO | 2012037007 A2 | 3/2012 |
| WO | 20111067502 W | 4/2012 |
| WO | 2012129454 A2 | 9/2012 |

OTHER PUBLICATIONS

Advanced Technology Materials, Inc., "ATMI VAC BF3 Isotopically Enriched: Safe Delivery Package for Boron Trifluoride Gas Source", Jun. 2005, Publisher: https://www.mathesongas.com/pdfs/products/VAC-Package-for-Isotopically-Enriched-Boron-Trifluoride.pdf.

Becher, H., et al., "Vibrational Spectra of Normal, Boron-10-Enriched, And Deuteriomethylboron Difuoride", "Spectrochimica Acta Part A: Molecular Spectroscopy", 1978, pp. 141-146 (English Abstract), vol. 34, No. 2.

Byl, O., et al., "Properties of Diboron Tetrafluoride (B2F4), A New Gas for Boron Ion Implantation", "AIP Conf. Proc., 18th International Conference on Ion Implantation Technology", Jun. 6-11, 2010, pp. 408-410, vol. CP1321, Published in: Kyoto, Japan.

Freer, B., et al., "Germanium Operation on the GSDIII/LED and Ultra High Current Ion Implanters", "Proceedings of the 14th International Conference on Ion Implantation Technology", Sep. 27, 2002, pp. 420-423.

Greenwell, D., et al., "Ion Implant Related Trends in Devices and Process Engineering", "Proceedings of the 11th International Conference on Ion Implantation Technology, Austin, TX", Jun. 16-21, 1996, pp. 1-4.

Hess, D., et al., "Performance Comparison of Enriched versus Non-Enriched SDS GeF4", "Conference on Ion Implantation Technology", Sep. 17-22, 2000, pp. 726-729.

Rendon, M., et al., "Reducing Arsenic to Germanium Cross-Contamination with Isotopically Enriched SDS 72GeF4", "Conference on Ion Implantation Technology", Sep. 17-22, 2000, pp. 707-710.

Sinn, C., et al., "Application of Isotopically Enriched Germanium Tetrafluoride for Contaminant Reduction and Ion Source Lifetime Benefits", "Proceedings of the 14th International Conference on Ion Implantation Technology", Sep. 27, 2002, pp. 411-412.

Weast, R. (Ed.), "Physical Constants of Inorganic Compounds—Boric Acid", "Handbook of Chemistry and Physics, 56th Edition", Sep. 1975, pp. B-78, Publisher: CRC Press, Inc.

Thomson Reuters, "XP-002713450—Ion implantation capable of preventing characteristic deterioration due to contamination in ion implantation process", "Database World Patent Index Week 200727", Jul. 5, 2006, p. 1.

Yu, J., et al, "Isotopically Enriched 10BN Nanotubes", "Advanced Materials", Jul. 2006, pp. 2157-2160, vol. 18.

Agarwal A. et al.: "Ion Implantation Science and Technology", Ion Implantation Technology Co., pp. 7-36, 10-2, 10-30, XP055359048, Jan. 1, 2004 (Jan. 1, 2004).

Chivers, D. J., "Freeman ion source: An overview (invited)," Review of Scientific Instruments, vol. 63, Issue 4, pp. 2501-2506 (Apr. 1, 1992).

Freeman, J. H., et al. "Ion beam studies, part VI: The production of heavy ion beams," Nuclear Instruments and Methods, North-Holland, vol. 145, Issue 3, pp. 473-505 (Sep. 15, 1977).

* cited by examiner

SILICON IMPLANTATION IN SUBSTRATES AND PROVISION OF SILICON PRECURSOR COMPOSITIONS THEREFOR

CROSS-REFERENCE TO RELATED APPLICATION APPLICATIONS

This application is a U.S. national phase under the provisions of 35 U.S.C. § 371 of International Patent Application No. PCT/US14/51162 filed Aug. 14, 2014, which in turn claims the benefit of priority under the provisions of 35 USC 119 of U.S. Provisional Patent Application 61/866,918 filed Aug. 16, 2013 in the names of Ying Tang, Joseph D. Sweeney, Tianniu Chen, James J. Mayer, Richard S. Ray, Oleg Byl, Sharad N. Yedave, and Robert Kaim for "SILICON IMPLANTATION IN SUBSTRATES AND PROVISION OF SILICON PRECURSOR COMPOSITIONS THEREFOR". The disclosures of such International Patent Application No. PCT/US14/51162 and U.S. Provisional Patent Application 61/866,918 are hereby incorporated herein by reference, in their respective entireties, for all purposes.

FIELD OF THE INVENTION

The present disclosure relates to compositions, systems and methods for implantation of silicon and/or silicon ions in substrates, e.g., in the manufacture of microelectronic products, solar cells, flat-panel displays, and the like.

DESCRIPTION OF THE RELATED ART

Implantation of silicon and/or silicon ions ("silicon ions" being used herein as inclusive of silicon ions per se, as well as silicon-containing ionic species) is commonly carried out in a variety of processes for the manufacture of microelectronic devices or device precursor structures. Silicon ions are conventionally generated by use of an ion source that receives a feedstock material for ionization from a supply vessel that is located in the gas box or otherwise in proximity to the ion source in the ion implantation system.

By way of example, silicon implantation may be employed to amorphize or otherwise alter the morphology of crystalline silicon in the manufacture of silicon devices. Silicon may be implanted in transistor structures to modify the etch rate of certain regions in order to modify their reactivity in subsequent etch steps. Silicon may also be implanted in the transistor structure to reduce contact resistance of source and drain regions of the transistor. Silicon is also used as a dopant for implantation in the manufacture of GaAs devices.

A commonly used feedstock material for Si+ implantation is $SiF_4$. Use of this material has been found to reduce the operational lifetime of the ion source. Without being bound by any theory, it is speculated that the presence of fluorine atoms and/or the combination of fluorine and silicon atoms in the source plasma leads to undesirable deposits that contribute to lessening the ion source lifetime. The fluorine can react with metals such as tungsten and molybdenum that are present in the implanter, and etch parts of the arc chamber while also causing tungsten or molybdenum deposition on arc chamber components such as the cathode, faceplate, etc. and electrode and source housing surfaces including high-voltage bushings, walls, etc. Excessive deposition can cause various problems, including arc slit whisker, cathode growth or shortage, arcing and other issues that cause corresponding source or beam issues that shorten the source life.

Another possible feedstock material for Si+ implantation is silane, $SiH_4$. This material is highly flammable and its use in ion implanters may be undesirable for safety reasons.

It would be a significant advance in the art to provide a silicon feedstock material that avoids the source lifetime issues that are associated with $SiF_4$, and that also avoids the safety issues that are associated with silane.

SUMMARY

The present disclosure relates to compositions, systems and methods for implantation of silicon and/or silicon ions in substrates.

In one aspect, the disclosure relates to a method of implanting silicon and/or silicon ions in a substrate, comprising:

generating silicon or silicon-containing ions from a composition comprising silicon precursor selected from the group consisting of:

(a) monosilanes of the formula $SiR^1R^2R^3R^4$ wherein each of $R^1$, $R^2$, $R^3$, and $R^4$ can independently be: H; halogen (F, Cl, Br, I); hydroxy; alkoxy; acetoxy; amino; alkyl of the formula $C_nH_{2n+1}$ wherein n=1-10, optionally substituted with hydroxy, alkoxy, acetoxy, and/or amino; cycloalkyl, bi- and polycycloalkyl, of the formula $C_nH_{2n-1}$ wherein n=1-10, optionally substituted with hydroxy, alkoxy, acetoxy, and/or amino; alkenyl of the formula $C_nH_{2n}$ including a C=C bond, wherein n=1-10, optionally substituted with hydroxy, alkoxy, acetoxy, and/or amino; aryl, including phenyl and aromatic moieties; alkylene including functionality of the formula $=CH_2$ and C $R^1R^2$ wherein each of $R^1$ and $R^2$ is as specified above, optionally substituted with hydroxy, alkoxy, acetoxy, and/or amino; alkylyne, including functionalities of the formulae ≡CH and ≡CR wherein R is $C_1$-$C_{10}$ alkyl, hydroxyl, halogen, or amino derivative of alkyl; or acyloxyl of the formula —OOCR wherein R is $C_1$-$C_{10}$ alkyl, hydroxyl, halogen, or amino derivative of alkyl;

(b) di- and polysilanes of the formula $Si_nH_y$, comprising at least one Si—Si bond, wherein n=1-8, and y=2n+2 for unbranched and branched chains, and y=2n for cyclic compounds and corresponding substituted di- and polysilanes of the formula $Si_nR^1R^2 \ldots R^y$ wherein n=1-8 and each of $R^1$, $R^2 \ldots R^y$ is as specified for each of $R^1$, $R^2$, $R^3$, and $R^4$ above;

(c) bridged silicon precursors of the formula $H_3Si$—X—$SiH_3$, wherein X is —$CR^1R^2$—, $GeR^1R^2$—, —NR—, —PR—, —O—, —S—, —S $R^1R^2$—, and —Se—, wherein each of R, $R^1$, and $R^2$ is as specified above, and corresponding substituted silicon precursors of the formula $R^1R^2R^3Si$—X—$SiR^4R^5R^6$ wherein X is as described above and each of $R^1$, $R^2 \ldots R^6$ is as specified for each of $R^1$, $R^2$, $R^3$, and $R^4$ above;

(d) polybridged, branched and cyclic silicon precursors of the formula $H_3Si$—X—$SiH_2$—Y—$SiH_2$—...Z—$SiH_3$, or otherwise containing Si—Si bonds, wherein X is —$CR^1R^2$—, $GeR^1R^2$—, —NR—, —PR—, —O—, —S—, —S $R^1R^2$—, and —Se—, wherein each of R, $R^1$, and $R^2$ is as specified above, and corresponding substituted branched silicon precursors wherein X, Y, and Z=C or N, and corresponding cyclic silicon precursors;

(e) silenes of the formula $H_2Si=SiH_2$, and corresponding substituted silenes of the formula $R^1R^2Si=SiR^3R^4$ wherein $R^1$, $R^2$, $R^3$, and $R^4$ are as specified above; and (f) silynes of the formula HSi≡SiH, and correspondingly substituted silynes of the formula $R^1Si\equiv SiR^2$ wherein $R^1$ and $R^2$ are as specified above;

(g) cluster silicon compounds;

(h) premixtures or co-flow mixtures comprising one or more of the foregoing precursors; and (i) one or more of the foregoing precursors, wherein said composition comprises gas that is isotopically enriched above natural abundance in at least one isotope thereof;

wherein said composition does not consist solely of (1) silicon tetrafluoride, (2) silane, (3) silicon tetrafluoride and silane mixture, or (4) silicon tetrafluoride, xenon and hydrogen; and implanting silicon or silicon ions in the substrate.

The disclosure relates in another aspect to a method of implanting silicon ions in a substrate, comprising:

(a) ionizing a silicon precursor comprising silicon tetrafluoride, $SiF_4$, wherein the silicon tetrafluoride is co-flowed or premixed with a fluororeaction suppressor; and (b) implanting silicon ions from said ionizing in the substrate.

In a further aspect, the disclosure relates to a silicon precursor composition for use in implantation of silicon and/or silicon ions in a substrate, said composition comprising at least one silicon precursor selected from the group consisting of:

(a) monosilanes of the formula $SiR^1R^2R^3R^4$ wherein each of $R^1$, $R^2$, $R^3$, and $R^4$ can independently be: H; halogen (F, Cl, Br, I); hydroxy; alkoxy; acetoxy; amino; alkyl of the formula $C_nH_{2n+1}$ wherein n=1-10, optionally substituted with hydroxy, alkoxy, acetoxy, and/or amino; cycloalkyl, bi- and polycycloalkyl, of the formula $C_nH_{2n-1}$ wherein n=1-10, optionally substituted with hydroxy, alkoxy, acetoxy, and/or amino; alkenyl of the formula $C_nH_{2n}$ including a C=C bond, wherein n=1-10, optionally substituted with hydroxy, alkoxy, acetoxy, and/or amino; aryl, including phenyl and aromatic moieties; alkylene including functionality of the formula $=CH_2$ and $C\ R^1R^2$ wherein each of $R^1$ and $R^2$ is as specified above, optionally substituted with hydroxy, alkoxy, acetoxy, and/or amino; alkylyne, including functionalities of the formulae $\equiv CH$ and $\equiv CR$ wherein R is $C_1$-$C_{10}$ alkyl, hydroxyl, halogen, or amino derivative of alkyl; or acyloxyl of the formula —OOCR wherein R is $C_1$-$C_{10}$ alkyl, hydroxyl, halogen, or amino derivative of alkyl;

(b) di- and polysilanes of the formula $Si_nH_y$ comprising at least one Si—Si bond, wherein n=1-8, and y=2n+2 for unbranched and branched chains, and y=2n for cyclic compounds and corresponding substituted di- and polysilanes of the formula $Si_nR^1R^2 \ldots R^y$ wherein n=1-8 and each of $R^1, R^2 \ldots R^y$ is as specified for each of $R^1$, $R^2$, $R^3$, and $R^4$ above;

(c) bridged silicon precursors of the formula $H_3Si$—X—$SiH_3$, wherein X is —$CR^1R^2$—, $GeR^1R^2$—, —NR—, —PR—, —O—, —S—, —S $R^1R^2$—, and —Se—, wherein each of R, $R^1$, and $R^2$ is as specified above, and corresponding substituted silicon precursors of the formula $R^1R^2R^3Si$—X—$SiR^4R^5R^6$ wherein X is as described above and each of $R^1, R^2 \ldots R^6$ is as specified for each of $R^1$, $R^2$, $R^3$, and $R^4$ above;

(d) polybridged, branched and cyclic silicon precursors of the formula $H_3Si$—X—$SiH_2$—Y—$SiH_2$— ... Z—$SiH_3$, or otherwise containing Si—Si bonds, wherein X is —$CR^1R^2$—, $GeR^1R^2$—, —NR—, —PR—, —O—, —S—, —S $R^1R^2$—, and —Se—, wherein each of R, $R^1$, and $R^2$ is as specified above, and corresponding substituted branched silicon precursors wherein X, Y, and Z=C or N, and corresponding cyclic silicon precursors;

(e) silenes of the formula $H_2Si=SiH_2$, and corresponding substituted silenes of the formula $R^1R^2Si=SiR^3R^4$ wherein $R^1$, $R^2$, $R^3$, and $R^4$ are as specified above;

(f) silynes of the formula HSi≡SiH, and correspondingly substituted silynes of the formula $R^1Si\equiv SiR^2$ wherein $R^1$ and $R^2$ are as specified above;

(g) cluster silicon compounds;

(h) one or more of the foregoing precursors in a premixture or co-flow form; and (i) one or more of the foregoing precursors comprising precursor that is isotopically enriched above natural abundance in at least one isotope thereof, wherein the composition does not consist solely of (1) silicon tetrafluoride, (2) silane, (3) silicon tetrafluoride and silane mixture, or (4) silicon tetrafluoride, xenon and hydrogen.

Another aspect of the disclosure relates to a silicon precursor composition, comprising at least one silicon precursor gas from Group A, optionally with additional gas or gases from Groups B, C, and D, wherein when only one silicon precursor gas from Group A is present, at least one additional gas from Groups B, C, and D is present as co-flow gas, or is mixed with the silicon precursor gas in a precursor gas mixture, and wherein:

Group A comprises silicon precursor gas selected from the group consisting of:

$SiF_4$ $SiH_4$ $SiH_xF_y$ wherein each of x and y is from 0 to 4

$SiH_xCl_y$ wherein each of x and y is from 0 to 4

$SiF_xCl_y$ wherein each of x and y is from 0 to 4

$SiH_xF_yCl_z$ wherein each of x, y and z is from 0 to 4;

Group B comprises hydrogen or hydride gases selected from the group consisting of:

$H_2$ $PH_3$ $AsH_3$ $NH_3$ $H_2Se$ $H_2S$ $CH_4$ $GeH_4$ $B_2H_6$ $SiH_4$

Group C comprises inert gases selected from the group consisting of:

Ne

Ar

Kr

He

Xe; and

Group D comprises other gases selected from the group consisting of:

$N_2$ $O_2$.

A further aspect of the disclosure relates to a silicon precursor composition, comprising silicon tetrafluoride and a fluororeaction suppressor, in a premixture or co-flow form.

In another aspect, the disclosure relates to a gas supply kit for an ion implantation system, comprising:

a first gas supply vessel holding a silicon precursor composition of the present disclosure; and a second gas supply vessel holding a co-flow gas for use with said silicon precursor composition.

A still further aspect the disclosure relates to a method of enhancing operation of an ion implantation system, comprising providing for use in the ion implantation system: a first gas supply vessel holding a silicon precursor composition of the present disclosure; and a second gas supply vessel holding a co-flow gas for use with said silicon precursor composition.

Yet another aspect the disclosure relates to a silicon precursor composition supply package, comprising a fluid storage and dispensing vessel, containing a silicon precursor composition of the present disclosure.

Additional aspects, features and embodiments of the disclosure will be more fully apparent from the ensuing description and appended claims.

DETAILED DESCRIPTION

Figure 1:
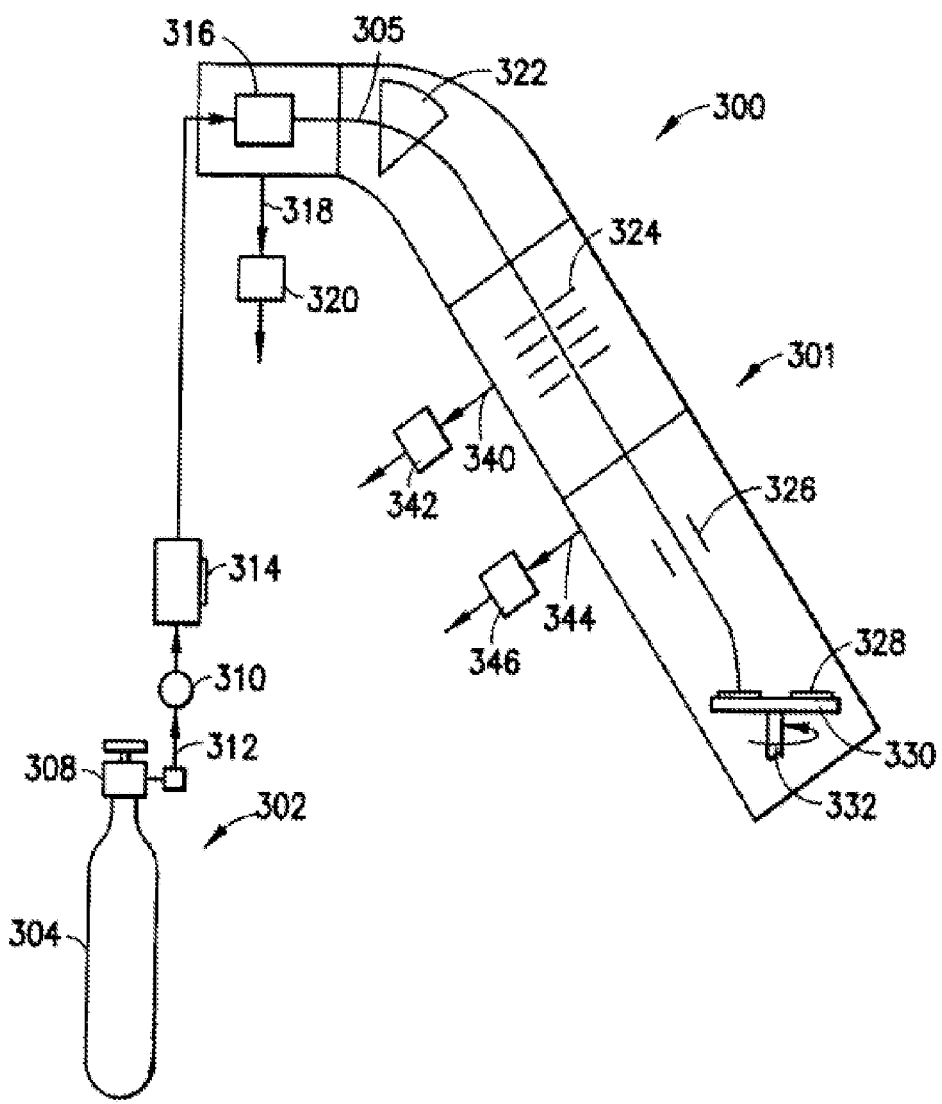
FIG. 1 is a schematic representation of an ion implant process system including a storage and dispensing vessel containing gas which is supplied for ion implantation doping of a substrate in the illustrated ion implant chamber.

The present disclosure relates to compositions, systems, and methods for silicon and silicon ion implantation.

As used herein and in the appended claims, the singular forms "a", "and", and "the" include plural referents unless the context clearly dictates otherwise.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range. In other words, a carbon number range is deemed to affirmatively set forth each of the carbon number species in the range, as to the substituent, moiety, or compound to which such range applies, as a selection group from which specific ones of the members of the selection group may be selected, either as a sequential carbon number sub-range, or as specific carbon number species within such selection group.

The same construction and selection flexibility is applicable to stoichiometric coefficients and numerical values specifying the number of atoms, functional groups, ions or moieties, as to specified ranges, numerical value constraints (e.g., inequalities, greater than, less than constraints), as well as oxidation states and other variables determinative of the specific form, charge state, and composition applicable to dopant sources, implantation species, and chemical entities within the broad scope of the present disclosure.

The precursors of the invention may be further specified in specific embodiments by provisos or limitations excluding specific substituents, groups, moieties or structures, in relation to various specifications and exemplifications thereof set forth herein. Thus, the invention contemplates restrictively defined compositions, e.g., a composition wherein $R^i$ is $C_1$-$C_{12}$ alkyl, with the proviso that $R^i \ne C_4$ alkyl when $R^j$ is silyl.

Accordingly, the disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the disclosure. The disclosure correspondingly contemplates such features, aspects and embodiments, or a selected one or ones thereof, in various permutations and combinations, as being within the scope of the present disclosure.

In one aspect, the present disclosure contemplates a method of implanting silicon and/or silicon ions in a substrate, comprising:
generating silicon or silicon-containing ions from a composition comprising silicon precursor selected from the group consisting of:
(a) monosilanes of the formula $SiR^1R^2R^3R^4$ wherein each of $R^1$, $R^2$, $R^3$, and $R^4$ can independently be: H; halogen (F, Cl, Br, I); hydroxy; alkoxy; acetoxy; amino; alkyl of the formula $C_nH_{2n+1}$ wherein n=1-10, optionally substituted with hydroxy, alkoxy, acetoxy, and/or amino; cycloalkyl, bi- and polycycloalkyl, of the formula $C_nH_{2n-1}$ wherein n=1-10, optionally substituted with hydroxy, alkoxy, acetoxy, and/or amino; alkenyl of the formula $C_nH_{2n}$ including a C=C bond, wherein n=1-10, optionally substituted with hydroxy, alkoxy, acetoxy, and/or amino; aryl, including phenyl and aromatic moieties; alkylene including functionality of the formula =$CH_2$ and C $R^1R^2$ wherein each of $R^1$ and $R^2$ is as specified above, optionally substituted with hydroxy, alkoxy, acetoxy, and/or amino; alkylyne, including functionalities of the formulae ≡CH and ≡CR wherein R is $C_1$-$C_{10}$ alkyl, hydroxyl, halogen, or amino derivative of alkyl; or acyloxyl of the formula —OOCR wherein R is $C_1$-$C_{10}$ alkyl, hydroxyl, halogen, or amino derivative of alkyl;
(b) di- and polysilanes of the formula $Si_nH_y$ comprising at least one Si—Si bond, wherein n=1-8, and y=2n+2 for unbranched and branched chains, and y=2n for cyclic compounds and corresponding substituted di- and polysilanes of the formula $Si_nR^1R^2 \ldots R^y$ wherein n=1-8 and each of $R^1, R^2 \ldots R^y$ is as specified for each of $R^1$, $R^2$, $R^3$, and $R^4$ above;

(c) bridged silicon precursors of the formula $H_3Si-X-SiH_3$, wherein X is $-CR^1R^2-$, $GeR^1R^2-$, $-NR-$, $-PR-$, $-O-$, $-S-$, $-S\ R^1R^2-$, and $-Se-$, wherein each of R, $R^1$, and $R^2$ is as specified above, and corresponding substituted silicon precursors of the formula $R^1R^2R^3Si-X-SiR^4R^5R^6$ wherein X is as described above and each of $R^1, R^2 \ldots R^6$ is as specified for each of $R^1, R^2, R^3$, and $R^4$ above;

(d) polybridged, branched and cyclic silicon precursors of the formula $H_3Si-X-SiH_2-Y-SiH_2-\ldots Z-SiH_3$, or otherwise containing Si—Si bonds, wherein X is $-CR^1R^2-$, $GeR^1R^2-$, $-NR-$, $-PR-$, $-O-$, $-S-$, $-S\ R^1R^2-$, and $-Se-$, wherein each of R, $R^1$, and $R^2$ is as specified above, and corresponding substituted branched silicon precursors wherein X, Y, and Z=C or N, and corresponding cyclic silicon precursors;

(e) silenes of the formula $H_2Si=SiH_2$, and corresponding substituted silenes of the formula $R^1R^2Si=SiR^3R^4$ wherein $R^1, R^2, R^3$, and $R^4$ are as specified above; and (f) silynes of the formula $HSi\equiv SiH$, and correspondingly substituted silynes of the formula $R^1Si\equiv SiR^2$ wherein $R^1$ and $R^2$ are as specified above;

(g) cluster silicon compounds;

(h) premixtures or co-flow mixtures comprising one or more of the foregoing precursors; and (i) one or more of the foregoing precursors, wherein said composition comprises gas that is isotopically enriched above natural abundance in at least one isotope thereof;

wherein said composition does not consist solely of (1) silicon tetrafluoride, (2) silane, (3) silicon tetrafluoride and silane mixture, or (4) silicon tetrafluoride, xenon and hydrogen; and implanting silicon or silicon ions in the substrate.

In such method, the silicon precursor may be ionized to generate silicon and/or silicon-containing ions. The ionizing may be carried out in any suitable manner. For example, the ionizing may be carried out so as to generate an ion beam of silicon dopant species, with the ion beam of the silicon dopant species being accelerated by electric field to implant silicon ions in a substrate. The method may be carried out in a method of manufacturing a product article, assembly or subassembly, comprising silicon-doped material. The product article, assembly or subassembly may be of any suitable type, and may for example be selected from among semiconductor product articles, assemblies and subassemblies, solar energy product articles, assemblies and subassemblies, and flat panel display product articles, assemblies and subassemblies.

The aforementioned methods may be carried out, with the silicon precursor and a second gas being co-flowed to an implantation process tool, being flowed contemporaneously as separate gas flow streams to the tool, or to a mixing manifold or other component or conduit in which the co-flow gas streams are mixed with one another and then flowed to the process tool. Alternatively, the silicon precursor and a second gas may be present in a silicon precursor composition as a mixture of such components, pre-mixed for such purpose.

The implantation itself may be of any suitable type, and may for example comprise beam-line ion implantation, plasma immersion ion implantation, or plasma doping.

In some embodiments of the present disclosure, the ionizing is effected in an ionization chamber, and the silicon precursor composition is delivered to said ionization chamber in a delivery conduit, with active cooling of at least one of said ionization chamber and delivery conduit, e.g., in instances in which the silicon precursor composition is otherwise susceptible of thermally-induced degradation or decomposition. The active cooling may thus involve reducing temperature of the silicon precursor composition entering the ionization chamber.

In various embodiments of the disclosure, the silicon precursor is isotopically enriched above natural abundance in at least one isotope of silicon. For example, the silicon precursor may be isotopically enriched above natural abundance in one or more isotopes of silicon selected from the group consisting of $^{28}Si$, $^{29}Si$, and $^{30}Si$, e.g., isotopically enriched above natural abundance in $^{29}Si$. In various applications, the silicon precursor may be isotopically enriched in $^{29}Si$ to a level of at least 10%, 15%, 20%, 25%, 30%, 35%, 40%, 45%, 50%, 55%, 60%, 65%, 70%, 75%, 80%, 85%, 90%, 95%, 97%, 98%, 99%, or more, up to 100%, based on the total isotopic species present in the silicon precursor material.

In some specific embodiments, the silicon precursor may be isotopically enriched in $^{29}Si$ level of from 30% to 70%, based on the total isotopic species present in the silicon precursor.

The implantation method of the present disclosure may be carried out with the silicon precursor being co-flowed to the ionizing with a co-flow gas, as mentioned. The co-flow gas may be of any suitable type, and may for example be selected from the group consisting of hydrides, halogens (fluorine, bromine, chlorine, iodine), halide compounds and complexes, carbon monoxide, carbon dioxide, carbonyl fluoride, xenon, xenon difluoride, oxygen, nitrogen, argon, neon, krypton, helium, $SiF_4$, $SiH_4$, $Si_2H_6$, methyl silanes, fluorosilanes, chlorosilanes, hydrogen selenide, hydrogen sulfide, diborane, methane, ammonia, phosphine, and arsine.

In some embodiments, the silicon precursor composition may comprise a gas other than the silicon precursor, and such other gas may be isotopically enriched above natural abundance in at least one isotope thereof.

In specific embodiments, the silicon precursor composition may comprise a silicon precursor selected from the group consisting of alkyl silanes;
bridged siloxanes;
compounds of the formula $R_nSiH_{(4-n)}$, wherein $0 \leq n \leq 4$, and $R_n$ is alkyl, alkoxyl, amido, alkylene, silyl, imido, hydrogens or acetate;
alkyl disilanes;
trisilylamine;
methyl silane;
$(MeHSi)_4O_4$;
$Me_2SiH_2$;
$EtSiH_3$;
$Me_3SiH$;
$(MeO)_3SiH$;
$Me_3SiSiMe_3$;
n-$BuSiH_3$;
$(SiH_3)_3N$;
$(MeHSi)_4O_4$, (TMCTS);
$Me_2SiH_2$;
$Si_2H_6$;
$Si_3H_8$;
$Me_2SiF_2$;
$HSiF_3$;
$SiCl_4$;
$SiHCl_3$;
$SiH_2Cl_2$;
$SiH_3Cl$;
$(NMe)_2Si_2H_4$;
$Me_3Si(CH_2CH_2)$;

($Me_3Si)_3SiH$;
($Me_2Si)_3(NHMe)_3$;
($Me_3Si)_3GeH$;
$[(tBu)NCH=CHN(tBu)]Si$;
($Me_3Si)_3N$;
$[(MeO)_3Si]_3N$;
$(C_2H_4O_2)_2Si$;
$Si(OOCCH_3)_4$;
$Me_3Si(NMe_2)$;
$SiH(NMe_2)_3$;
$Me_3SiEt$;
$Me_2SiCH_2NH_2$;
$Me_3SiNHSiMe_3$;
$Si(OC_2H_5)_4$;
partially fluorinated or chlorinated materials;
in-situ generated materials;
molecules containing both halogen and hydrogen;
and
derivatives and mixtures thereof.

In other embodiments, the silicon precursor composition comprises silicon precursor selected from the group consisting of:
(a) silicon-containing precursors selected from the group consisting of:
  (i) monomers of the formula $Si(R^1R^2R^3R^4)$ or $(R^1R^2)$ Si: (silylenes);
  (ii) dimers of the formula $[Si(R^1R^2R^3)]_2$;
  (iii) trimers of the formula $[Si(R^1R^2)]_3$; and
  (iv) tetramers of the formula $[Si(R^1)]_4$,
  wherein $R^1$, $R^2$, $R^3$ and $R^4$ are each independently selected from: $C_1$-$C_8$ alkyl; silyl; amino; amido; imido; $C_1$-$C_8$ alkoxy; siloxy; halo; mono-, di-, and tri-alkylsilyl, wherein alkyl is $C_1$-$C_8$ alkyl; mono- and di-alkylamino, wherein alkyl is $C_1$-$C_8$ alkyl;
(b) bipyridine and alkyne silane adducts;
(c) silicon selenides comprising silicon directly bonded to selenium (Si—Se bonds), and
(d) precursors (a)-(c) that have been isotopically enriched above natural abundance in at least one silicon isotope.

In some specific embodiments, the method of the present disclosure may be carried out with a silicon precursor composition comprising a precursor selected from (d) above.

The implantation method of the present disclosure may be carried out with the ionizing being conducted in an arc chamber, with the arc chamber having disposed therein an arc chamber liner selected from the group consisting of (1) lanthanated tungsten liners, (2) WSi liners, (3) silicon liners, and (4) graphite liners.

In various particular embodiments, the implantation method of the disclosure is carried out, with the silicon precursor composition comprising at least one silicon precursor gas from Group A, optionally with additional gas or gases from Groups B, C, and D, wherein when only one silicon precursor gas from Group A is present, at least one additional gas from Groups B, C, and D is present as co-flow gas, or is mixed with the silicon precursor gas in a precursor gas mixture, and wherein:

Group A comprises silicon precursor gas selected from the group consisting of:
$SiF_4$
$SiH_4$
$SiH_xF_y$ wherein each of x and y is from 0 to 4
$SiH_xCl_y$ wherein each of x and y is from 0 to 4
$SiF_xCl_y$ wherein each of x and y is from 0 to 4
$SiH_xF_yCl_z$ wherein each of x, y and z is from 0 to 4;

Group B comprises hydrogen or hydride gases selected from the group consisting of:
$H_2$
$PH_3$
$AsH_3$
$NH_3$
$H_2Se$
$H_2S$
$CH_4$
$GeH_4$
$B_2H_6$
$SiH_4$ Group C comprises inert gases selected from the group consisting of:
Ne
Ar
Kr
He
Xe; and Group D comprises other gases selected from the group consisting of:
$N_2$
$O_2$.

In another aspect, the disclosure relates to a method of implanting silicon ions in a substrate, comprising:
(a) ionizing a silicon precursor comprising silicon tetrafluoride, $SiF_4$, wherein the silicon tetrafluoride is co-flowed or premixed with a fluororeaction suppressor; and
(b) implanting silicon ions from said ionizing in the substrate.

The fluororeaction suppressor may be of any suitable type, and may for example comprise at least one of (i) hydrogen, (ii) hydride gas, and (iii) nitrogen, in specific embodiments. In other embodiments, the fluororeaction suppressor may comprise silane. In still other embodiments, the fluororeaction suppressor may comprise ammonia. In yet further embodiments, the fluorescer suppressor may comprise nitrogen.

The disclosure in another aspect relates to a silicon precursor composition for use in implantation of silicon and/or silicon ions in a substrate, said composition comprising at least one silicon precursor selected from the group consisting of:
(a) monosilanes of the formula $SiR^1R^2R^3R^4$ wherein each of $R^1$, $R^2$, $R^3$, and $R^4$ can independently be: H; halogen (F, Cl, Br, I); hydroxy; alkoxy; acetoxy; amino; alkyl of the formula $C_nH_{2n+1}$ wherein n=1-10, optionally substituted with hydroxy, alkoxy, acetoxy, and/or amino; cycloalkyl, bi- and polycycloalkyl, of the formula $C_nH_{2n-1}$ wherein n=1-10, optionally substituted with hydroxy, alkoxy, acetoxy, and/or amino; alkenyl of the formula $C_nH_{2n}$ including a C=C bond, wherein n=1-10, optionally substituted with hydroxy, alkoxy, acetoxy, and/or amino; aryl, including phenyl and aromatic moieties; alkylene including functionality of the formula =$CH_2$ and C $R^1R^2$ wherein each of $R^1$ and $R^2$ is as specified above, optionally substituted with hydroxy, alkoxy, acetoxy, and/or amino; alkylyne, including functionalities of the formulae ≡CH and ≡CR wherein R is $C_1$-$C_{10}$ alkyl, hydroxyl, halogen, or amino derivative of alkyl; or acyloxyl of the formula —OOCR wherein R is $C_1$-$C_{10}$ alkyl, hydroxyl, halogen, or amino derivative of alkyl;
(b) di- and polysilanes of the formula $Si_nH_y$ comprising at least one Si—Si bond, wherein n=1-8, and y=2n+2 for unbranched and branched chains, and y=2n for cyclic compounds and corresponding substituted di- and polysilanes of the formula $Si_nR^1R^2 \ldots R^y$ wherein n=1-8 and each of $R^1, R^2 \ldots R^y$ is as specified for each of $R^1, R^2, R^3$, and $R^4$ above;
(c) bridged silicon precursors of the formula $H_3Si—X—SiH_3$, wherein X is $—CR^1R^2—$, $GeR^1R^2—$, —NR—, —PR—, —O—, —S—, —S $R^1R^2—$, and —Se—, wherein each of R, $R^1$, and $R^2$ is as specified above, and corresponding substituted silicon precursors of the formula $R^1R^2R^3Si—X—SiR^4R^5R^6$ wherein X is as described above and each of $R^1, R^2 \ldots R^6$ is as specified for each of $R^1, R^2, R^3$, and $R^4$ above;
(d) polybridged, branched and cyclic silicon precursors of the formula $H_3Si—X—SiH_2—Y—SiH_2—\ldots Z—SiH_3$, or otherwise containing Si—Si bonds, wherein X is $—CR^1R^2—$, $GeR^1R^2—$, —NR—, —PR—, —O—, —S—, —S $R^1R^2—$, and —Se—, wherein each of R, $R^1$, and $R^2$ is as specified above, and corresponding substituted branched silicon precursors wherein X, Y, and Z=C or N, and corresponding cyclic silicon precursors;
(e) silenes of the formula $H_2Si=SiH_2$, and corresponding substituted silenes of the formula $R^1R^2Si=SiR^3R^4$ wherein $R^1, R^2, R^3$, and $R^4$ are as specified above;
(f) silynes of the formula HSi≡SiH, and correspondingly substituted silynes of the formula $R^1Si≡SiR^2$ wherein $R^1$ and $R^2$ are as specified above;
(g) cluster silicon compounds;
(h) one or more of the foregoing precursors in a premixture or co-flow form; and
(i) one or more of the foregoing precursors comprising precursor that is isotopically enriched above natural abundance in at least one isotope thereof,
wherein the composition does not consist solely of (1) silicon tetrafluoride, (2) silane, (3) silicon tetrafluoride and silane mixture, or (4) silicon tetrafluoride, xenon and hydrogen.

The aforementioned composition may in certain applications comprise silicon precursor isotopically enriched above natural abundance in at least one isotope of silicon, e.g., in one or more isotopes of silicon selected from the group consisting of $^{28}Si$, $^{29}Si$, and $^{30}Si$. The silicon precursor may for example be isotopically enriched above natural abundance in $^{29}Si$, or isotopically enriched above natural abundance in an isotope other than $^{29}Si$. The composition in various embodiments may comprise silicon precursor that is isotopically enriched in $^{29}Si$ to a level of at least 10%, 15%, 20%, 25%, 30%, 35%, 40%, 45%, 50%, 55%, 60%, 65%, 70%, 75%, 80%, 85%, 90%, 95%, 97%, 98%, 99%, or more, up to 100%, based on the total isotopic species present in the silicon precursor material. In other embodiments, the silicon precursor may be isotopically enriched in $^{29}Si$ level of from 30% to 70%, based on the total isotopic species present in the silicon precursor.

As indicated, compositions of the present disclosure may comprise the silicon precursor and co-flow gas, such as a co-flow gas selected from the group consisting of hydrides, halogens (fluorine, bromine, chlorine, iodine), halide compounds and complexes, carbon monoxide, carbon dioxide, carbonyl fluoride, xenon, xenon difluoride, oxygen, nitrogen, argon, neon, krypton, helium, $SiF_4$, $SiH_4$, $Si_2H_6$, methyl silanes, fluorosilanes, chlorosilanes, hydrogen selenide, hydrogen sulfide, diborane, methane, ammonia, phosphine, and arsine.

In other variations, the silicon precursor composition may comprise a gas other than the silicon precursor, in which the other gas is isotopically enriched above natural abundance in at least one isotope thereof.

Silicon precursor compositions of the present disclosure may comprise silicon precursor selected from the group consisting of
alkyl silanes;
bridged siloxanes;
compounds of the formula $R_nSiH_{(4-n)}$, wherein 0≤n≤4, and $R_n$ is alkyl, alkoxyl, amido, alkylene, silyl, imido, hydrogens or acetate;
alkyl disilanes;
trisilylamine;
methyl silane;
$(MeHSi)_4O_4$;
$Me_2SiH_2$;
$EtSiH_3$;
$Me_3SiH$;
$(MeO)_3SiH$;
$Me_3SiSiMe_3$;
$n-BuSiH_3$;
$(SiH_3)_3N$;
$(MeHSi)_4O_4$, (TMCTS);
$Me_2SiH_2$;
$Si_2H_6$;
$Si_3H_8$;
$Me_2SiF_2$;
$HSiF_3$;
$SiCl_4$;
$SiHCl_3$;
$SiH_2Cl_2$;
$SiH_3Cl$;
$(NMe)_2Si_2H_4$;
$Me_3Si(CH_2CH_2)$;
$(Me_3Si)_3SiH$;
$(Me_2Si)_3(NHMe)_3$;
$(Me_3Si)_3GeH$;
$[(tBu)NCH=CHN(tBu)]Si$;
$(Me_3Si)_3N$;
$[(MeO)_3Si]_3N$;
$(C_2H_4O_2)_2Si$;
$Si(OOCCH_3)_4$;
$Me_3Si(NMe_2)$;
$SiH(NMe_2)_3$;
$Me_3SiEt$;
$Me_2SiCH_2NH_2$;
$Me_3SiNHSiMe_3$;
$Si(OC_2H_5)_4$;
partially fluorinated or chlorinated materials;
in-situ generated materials;
molecules containing both halogen and hydrogen; and
derivatives and mixtures thereof.

In specific applications, the composition may comprise silicon precursor selected from the group consisting of:
(a) silicon-containing precursors selected from the group consisting of:
  (i) monomers of the formula $Si(R^1R^2R^3R^4)$ or $(R^1R^2)$Si: (silylenes);
  (ii) dimers of the formula $[Si(R^1R^2R^3)]_2$;
  (iii) trimers of the formula $[Si(R^1R^2)]_3$; and
  (iv) tetramers of the formula $[Si(R^1)]_4$,
wherein $R^1, R^2, R^3$ and $R^4$ are each independently selected from: $C_1$-$C_8$ alkyl; silyl; amino; amido; imido; $C_1$-$C_8$ alkoxy; siloxy; halo; mono-, di-, and tri-alkylsilyl, wherein alkyl is $C_1$-$C_8$ alkyl; mono- and di-alkylamino, wherein alkyl is $C_1$-$C_8$ alkyl;

(b) bipyridine and alkyne silane adducts;
(c) silicon selenides comprising silicon directly bonded to selenium (Si—Se bonds), and
(d) precursors (a)-(c) that have been isotopically enriched above natural abundance in at least one silicon isotope.

The composition may for example be constituted, with the silicon precursor being selected from (d).

In another embodiment, the disclosure contemplates a silicon precursor composition, comprising at least one silicon precursor gas from Group A, optionally with additional gas or gases from Groups B, C, and D, wherein when only one silicon precursor gas from Group A is present, at least one additional gas from Groups B, C, and D is present as co-flow gas, or is mixed with the silicon precursor gas in a precursor gas mixture, and wherein:

Group A comprises silicon precursor gas selected from the group consisting of:
$SiF_4$
$SiH_4$
$SiH_xF_y$, wherein each of x and y is from 0 to 4
$SiH_xCl_y$, wherein each of x and y is from 0 to 4
$SiF_xCl_y$, wherein each of x and y is from 0 to 4
$SiH_xF_yCl_z$ wherein each of x, y and z is from 0 to 4;

Group B comprises hydrogen or hydride gases selected from the group consisting of:
$H_2$
$PH_3$
$AsH_3$
$NH_3$
$H_2Se$
$H_2S$
$CH_4$
$GeH_4$
$B_2H_6$
$SiH_4$ Group C comprises inert gases selected from the group consisting of:
Ne
Ar
Kr
He
Xe; and Group D comprises other gases selected from the group consisting of:
$N_2$
$O_2$.

In a further aspect, the disclosure relates to a silicon precursor composition, comprising silicon tetrafluoride and a fluororeaction suppressor, in a premixture or co-flow form. The fluororeaction suppressor in such composition may be of any suitable type, and may for example comprise one or more of hydrogen, hydride gas, nitrogen, silane, and ammonia. In one specific embodiment, the fluororeaction suppressor may comprise nitrogen. In another specific embodiment, the fluororeaction suppressor may comprise ammonia.

The disclosure further contemplates a gas supply kit for an ion implantation system, comprising:
a first gas supply vessel holding a silicon precursor composition of the present disclosure; and a second gas supply vessel holding a co-flow gas for use with said silicon precursor composition.

In a specific embodiment of such gas supply kit, the silicon precursor composition may comprise silicon tetrafluoride, and the co-flow gas may comprise a fluororeaction suppressor gas. Such gas supply kit may be constituted, with the silicon tetrafluoride being isotopically enriched in at least one silicon isotope. The fluororeaction suppressor gas may comprise one or more of hydrogen, hydride gas, nitrogen, silane, and ammonia. The gas supply kit may comprise the silicon precursor composition, in one gas supply vessel, and nitrogen, or ammonia, as the fluororeaction suppressor gas in another gas supply vessel.

A further aspect of the present disclosure relates to a method of enhancing operation of an ion implantation system, comprising providing for use in the ion implantation system: a first gas supply vessel holding a silicon precursor composition according to the present disclosure; and a second gas supply vessel holding a co-flow gas for use with said silicon precursor composition.

As discussed above, the first gas supply vessel may contain silicon tetrafluoride, and the second gas supply vessel may contain the fluororeaction suppressor gas as the co-flow gas.

In the aforementioned method, wherein the silicon precursor composition comprises silicon tetrafluoride, the silicon tetrafluoride may be isotopically enriched in at least one silicon isotope.

The fluororeaction suppressor gas, in the operational enhancement method, may comprise any suitable gas, e.g., one or more of hydrogen, hydride gas, nitrogen, silane, and ammonia.

The disclosure in a further aspect relates to a silicon precursor composition supply package, comprising a gas storage and dispensing vessel, containing a silicon precursor composition of the present disclosure. The gas storage and dispensing vessel may contain a storage medium for the silicon precursor composition, such as a physical adsorbent medium, or an ionic liquid storage medium. In other embodiments, the gas storage and dispensing vessel comprises a pressure-regulated vessel including a pressure-regulating assembly in an interior volume of the vessel.

The present disclosure therefore provides a method of implanting silicon, silicon ions or silicon-containing ions into a target substrate such as a semiconductor wafer, or other substrate useful in the manufacture of microelectronic products, solar cells, flat-panel displays, and the like. This method may be carried out by ionizing a silicon-containing dopant material to produce a plasma having ions, and implanting the ions into the target substrate.

Examples of illustrative silicon-containing dopant compounds or materials that can be employed in the practice of the present disclosure include alkyl silanes, bridged siloxanes, compounds with the chemical formula $R_nSiH_{(4-n)}$, where $1 \leq n \leq 4$, and $R_n$ is an alkyl, alkoxyl, amido, alkylene, silyl, imido, hydrogen or acetate group, alkyl disilanes, and derivatives and mixtures thereof. Specific examples of suitable silicon-containing dopant compounds or materials include: trisilylamine, or $(SiH_3)_3N$; methyl silane, or $MeSiH_3$; TMCTS, or $(MeHSi)_4O_4$; dimethyl silane, or $Me_2SiH_2$; ethyl silane, or $EtSiH_3$; trimethyl silane, or $Me_3SiH$; trimethoxysilane, or $(MeO)_3SiH$; hexamethyl disilane, or $Me_3SiSiMe_3$; TEOS, or $Si(OC_2H_5)_4$; and n-butyl silane, or $n-BuSiH_3$. Additional dopant materials include partially fluorinated or chlorinated materials as well as in-situ generated materials, and molecules that contain both halogen and hydrogen.

Additional examples of suitable materials and their associated characteristics are set out in the Tables 1 and 2 below.

TABLE 1

| Class | Chemical Name | Chemical Formula | C/Si ratio | Melting Point, C. | Boiling Point, C. | Pvap, torr {@23 C.} | LEL; Flammable? | Flashpoint nt, C. |
|---|---|---|---|---|---|---|---|---|
| | Trisilylamine | $(SiH_3)_3N$ | 0 | −106 | 52 | 315 | Flammable, not pyrophoric | <0 |
| AlkylSilane | MethylSilane | $MeSiH_3$ | 1 | −156 | −57.2 | 193 psig @ 25 C. | 1.30% | |
| Bridged siloxane | TMCTS | $(MeHS)_4O_4$ | 1 | −69 | 134-5 | 7 torr @ 20 C. | 0.70% | |
| AlkylSilane | Dimethylsilane | $Me_2SiH_2$ | 2 | −150 | −19.6 | 419 psig @ 20 C. | 1.20% | 24 |
| AlkylSilane | Ethyl Silane | $EtSiH_3$ | 2 | −132 | 56 | 3080 (calc.) | Flammable | −108 |
| AlkylSilane | Trimethylsilane | $Me_3SiH$ | 3 | −136 | 6.7 | 7 psig @ 20 C. | 1.30% | <40 |
| $RnSiH(4-n)$alkoxy | Trimethoxysilane | $(MeO)_3SiH$ | 3 | −114 | 86-7 | 38.8 (calc.) | Yes | −689 |
| AlkylDisilane | Hexamethyldisilane | $Me_3SiSiMe_3$ | 3 | 13 | 112-3 | 22.9 torr @ 20 C. | Yes | −4 |
| AlkylSilane | n-Butyl Silane | $n\text{-}BuSiH_3$ | 4 | −138 | 56 | 280 torr @ 25 C. (calc.) | Yes | 11 |
| | | | | | | | | <0 C. |

TABLE 2

| Class | Chemical Name | Chemical Formula | C/Si ratio | Melting Point, C. | Boiling Point, C. | Pvap, torr {@23 C.} | LEL; Flammable? |
|---|---|---|---|---|---|---|---|
| Silanes | Disilane | $Si_2H_6$ | | | −14.3 | 2940 at 25 C. (calc.) | Pyrophoric |
| | Trisilane | $Si_3H_8$ | | | 52 | 285 torr at 25 C. (calc.) | Pyrophoric |
| $SiF_x(CH_3)_{4-x}$ | Dimethyldifluorosilane | $Me_2SiF_2$ | | (−88) | (2-3) | 1809 torr @ 20 C. | Yes |
| $SiF_xH_y$ | Trifluorosilane | $HSiF_3$ | | (−131) | (−97.5) | Gas or Liquified Gas | |
| $SiCl_xH_y$ | Silicon tetrachloride | $SiCl_4$ | | −69 | 57 | 310 | No |
| | Trichlorosilane | $SiHCl_3$ | | −128 | 31.8 | 775 | 1.2 vol % |
| | Dichlorosilane | $SiH_2Cl_2$ | | −122 | 8.3 | 1000 | 4 vol % |
| | Monochlorosilane | $SiH_3Cl$ | | −118 | −30 | 4900 | Pyrophoric |
| Amido Disilane | | $(NMe)_2Si_2H_4$ | 1 | | 184 (calc.) | 0.75 torr at 25 C. | |
| $R_nSiH_{(4-n)}$ alkylene or alkyl | | $Me_3Si(CH_2CH_2)$ | | | | | Probable |
| $H_{(4-x)}Si\text{—}(SiR_3)_x$ | | $(Me_3Si)_3SiH$ | | | (82-4 C., @ 12 torr) | 0.24 (calc.) | |
| | Hexamethyltrisilazane | $(Me_2Si)_3(NHMe)_3$ | | (−10) | 186-8 | 0.17 (calc.) | |
| Si/Ge | | $(Me_3Si)_3GeH$ | | | | | |
| | | $[(tBu)NCH=CHN(tBu)]Si$ | | | | | |
| | Tris(trimethylsilyl)amine | $(Me_3Si)_3N$ | 3 | 70 | 189 | | |
| | | $[(MeO)_3Si]_3N$ | 3 | | 110 | | |
| | Ethylene silicate | $(C_2H_4O_2)_2Si$ | 4 | | 96 | | |
| | Silicon tetra-acetate | $Si(OOCCH_3)_4$ | 4 | | 110 | 160-170 | |
| $R_nSiH_{(4-n)}$amido | DMATMS | $Me_3Si(NMe_2)$ | 5 | | 86 | 66.5 torr at 25 C. (calc.) | Probable |
| | 4DMAS | $SiH(NMe_2)_3$ | 6 | | 148 | 7.1 torr @ 25 C. | 2.80% |
| | | $Me_3SiEt$ | 5 | | 65 | 2.20 torr at 25 C. (calc.) | Probable |
| | | $Me_2SiCH_2NH_2$ | 3 | | 94 | 149 torr at 25 C. (calc.) | Probable |
| Silazane | Hexmethyldisilazane | $Me_3SiNHSiMe_3$ | 3 | | 126-7 | 11.9 (calc.) | Likely |
| In-situ generated $SiH_4$ | Polydimethylsilane | | | | | | |
| | Polycarbosilane | | | | | | |

Preferably, silicon-containing dopant compounds or materials utilized in the practice of the present disclosure are in a gaseous state under appertaining end use conditions. Suitable dopant source materials also include liquid or solid silicon-containing dopant compounds or materials having adequate vapor pressure to provide sufficient flow of vapors to the ion source chamber of an ion implantation system In various embodiments, silicon ions or silicon-containing ions are generated from a feedstock source material and implanted into the target material of a substrate via an ion implantation process.

In one illustrative embodiment, an ion source generates the silicon ions by introducing electrons into a vacuum arc chamber filled with a silicon-containing dopant gas as the feedstock material. Collisions of the electrons with molecules in the silicon-containing dopant gas result in the creation of ionized plasma containing positive silicon ions. The ions are then collimated into an ion beam, which is accelerated towards the target material. The ion beam may be directed through a mask having a plurality of openings therein to implant the silicon ions in the desired configuration.

The present disclosure is not limited in this regard as other means of implanting silicon ions are within the scope of the present disclosure.

Silicon precursors of the present disclosure, isotopically enriched, or non-enriched, may be utilized in feed gas mixtures, co-flow arrangements, e.g., with co-species (other silicon-containing fluids, which may be enriched or non-enriched in character) and/or diluent gases, as well as in sequential flow systems in which the silicon precursor is intermittently and repetitively flowed to a process tool.

Silicon precursors of the present disclosure may be isotopically enriched above natural abundance in silicon isotopes of any isotopic species, up to isotopic enrichment of 100% in single isotopic species.

The present disclosure contemplates implantation of silicon di-, tri-, and tetramers, and other cluster silicon implantation compositions. The silicon precursor composition may be constituted to provide ionic species containing more than one atom of silicon and/or other atoms for ion implantation. Precursors comprising more than one silicon atom include disilanes, trisilanes, and other compounds containing Si—Si bonds. Substituted silanes containing carbon, germanium, boron, phosphorus, or other constituents, may be employed to enhance amorphization efficacy of the silicon implant species derived from such silicon precursors. For example, the present disclosure contemplates Si- and C-containing species, or Si- and Ge-containing species, derived from corresponding silicon precursors to impart tensile or compressive stress in the correspondingly implanted substrate.

In another aspect, the deleterious effects of fluorine that is present in silicon tetrafluoride, $SiF_4$, are significantly lessened by co-flow or mixture of $SiF_4$ with (i) a hydrogen or a hydride gas such as $SiH_4$, $NH_3$, and the like, and/or (ii) nitrogen ($N_2$). This approach is based on hydrogen and/or nitrogen intercepting the fluorine reaction with the arc chamber material, e.g., tungsten or molybdenum, thereby reducing the fluorine reaction and correspondingly lessening the etching, deposition and halogen cycle. We have empirically demonstrated that the F+, W+, and $WF_x$ peak in the $SiF_4$ beam will be significantly reduced when $SiF_4$ is mixed with hydrogen, nitrogen, or with both hydrogen and nitrogen. The method of effecting such mixture can be either co-flow, or pre-mixture, of the $SiF_4$ with the fluororeaction suppressor component(s). The concentration of the fluororeaction suppressor, e.g., $H_2$ or $H_2/N_2$, can be from 0.001% to 99.999% by volume, more preferably from 0.01% to 30% by volume, and most preferably from 2% to 20% by volume, based on total volume of silicon tetrafluoride and the fluororeaction suppressor component(s).

The utilization of a fluororeaction suppressor composition as a co-flow or mixture constituent is advantageously employed in implanters of any suitable type. In general, the compositions and processes of the present disclosure can be carried out with implanter equipment suitable for use for manufacturing semiconductor, solar and flat panel products, e.g., beamline implanters, plasma immersion tools such as PLAD tools, ion shower implanters, etc.

The approach of using a reaction suppressor can also be applied using other fluoride gases, such as for example $GeF_4$, $AsF_3$, and $PF_3/PF_5$ in co-flow or mixture with gases such as hydrogen, ammonia, other hydride gases, and/or nitrogen.

In a specific aspect, the disclosure relates to the use of gas co-flow or pre-mixture to provide improvements in beam performance and/or source life.

The gases can be utilized in arrangements involving co-flow, pre-mixture, or combinations of co-flow and pre-mixture. For such purpose, the gas composition can include a total of from 2 to 50 gases, with individual gas species present in the co-flow or pre-mixtures at concentrations that may range from 0.0001 mol. % to 99.9999 mol. %, with all co-flow or pre-mixture components totaling to 100 mol. %.

The silicon precursors of the present disclosure may be ionized for implantation applications in any suitable manner and utilizing any suitable ionizing apparatus or systems. For example, ionization may be carried out involving electron impact, radio frequency exposure, microwave impingement, pulsed plasma techniques, IHC plasma processes, etc. The silicon precursors can be delivered to the locus of use in any suitable manner, such as by placement of the precursor supply vessel on a process tool, or alternatively by remote delivery placement of the precursor supply vessel, or alternatively by on-demand generation of the silicon precursor, either remotely or at the point of use.

The implantation of silicon implants species deriving from the silicon precursor may be utilized in any suitable applications, including the manufacture of semiconductor products, integrated circuitry, solar cells, flat-panel displays, LEDs, and other ion implantation products.

Silicon precursors of the present disclosure enable process improvements in silicon implantation, including beam current improvements in ion beam processes, such as increased absolute value of beam current, temporal and spatial stability of the ion beam, and additionally can significantly enhance ion source performance, e.g., in extension of source life.

In the delivery of silicon precursors of the present disclosure to the ion source of ion implantation systems, cooling of the arc chamber and/or cooling of the delivery line to the arc chamber may be employed for silicon precursors that are not thermally stable and that in the absence of such cooling would decompose prior to being received in the arc chamber. In other embodiments, the delivery line to the arc chamber may be heated for vapor delivery of the silicon precursor, so as to avoid condensation in the delivery line.

Source life and/or beam current can also be improved in other embodiments by use of appropriate arc chamber liner materials. Illustrative liners include, without limitation, lanthanated tungsten liners that may be of significant benefit in improving source life, WSi liners that may inhibit warping that could otherwise occur with 100% tungsten liners, silicon liners that may serve to reduce the halogen cycle that can cause source failures, and may increase team current and graphite liners.

Referring now to the drawings, FIG. 1 is a schematic representation of an ion implant process system including a storage and dispensing vessel containing a silicon-containing dopant gas or other silicon precursor source material that is supplied for ion implantation doping of a substrate in the illustrated ion implant chamber.

The ion implant process system 300 includes a storage and dispensing vessel 302 holding silicon source material that is supplied for ion implantation doping of a substrate 328 in the illustrated ion implant chamber 301.

The storage and dispensing vessel 302 comprises a vessel wall 306 enclosing an interior volume holding the silicon source material.

The vessel may be a gas cylinder of conventional type, with an interior volume arranged to hold only gas, or alternatively, the vessel may contain a sorbent material having sorptive affinity for a silicon-containing dopant source gas, and from which the dopant source gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc.

The ion implant chamber 301 contains an ion beam generator or ionizer 316 receiving the dispensed silicon-containing source material from line 312 and generating an ion beam 305. The ion beam 305 passes through the mass analyzer unit 322 which selects the ions needed and rejects the non-selected ions.

The selected ions pass through the acceleration electrode array 324 and then the deflection electrodes 326. The resultantly focused ion beam is impinged on the substrate element 328 disposed on the rotatable holder 330 mounted in turn on spindle 332. The ion beam of Si+ ions or other silicon-containing ions is used to dope the substrate as desired to form a silicon-doped structure.

The respective sections of the ion implant chamber 301 are exhausted through lines 318, 340 and 344 by means of pumps 320, 342 and 346, respectively.

Any suitable ion source may be usefully employed in an ion implantation system of the type shown in FIG. 1, e.g., an ion source of a type as more fully described in U.S. Pat. No. 6,135,128 issued Oct. 24, 2000 to M. A. Graf, et al.

The ion source may for example comprise a housing that defines a plasma chamber, and an ion extractor assembly. Energy is imparted to the ionizable silicon source material to generate ions within the plasma chamber. The ions are extracted through a slit in the plasma chamber by an ion extractor assembly, which comprises a plurality of electrodes. Accordingly, the ion extractor assembly functions to extract a beam of ions from the plasma chamber through an extraction aperture plate and to accelerate the extracted ions toward a mass analysis magnet.

In such an arrangement, an ionizable silicon source material can be flowed from a suitable supply apparatus for same and injected into the plasma chamber through a conduit containing a mass flow controller therein. The supply apparatus may include a sorbent-based gas storage and supply vessel, e.g., of a type as commercially available from Entegris, Inc. (Billerica, Mass., USA) under the trademark SDS, a pressure-regulated vessel including an internal gas pressure regulator, e.g., of a type commercially available from Entegris, Inc. (Billerica, Mass., USA) under the trademark VAC, a pressure-regulated vessel including an internal gas pressure regulator, e.g., of a type as commercially available from Entegris, Inc. (Billerica, Mass., USA) under the trademark VACSorb, or, when a solid dopant source material is employed, the source may include a solid source vessel, e.g., of a type as commercially available from Entegris, Inc. (Billerica, Mass., USA) under the trademark ProEvap.

The ion implantation process of the disclosure, in which a silicon-containing source material is employed, can be practiced in a wide variety of ion implanter systems, within the skill of the art, based on the disclosure herein, to enable the commercial production of a wide variety of microelectronic products, e.g., semiconductor products, including component parts or device structures doped with silicon.

Figure 2:
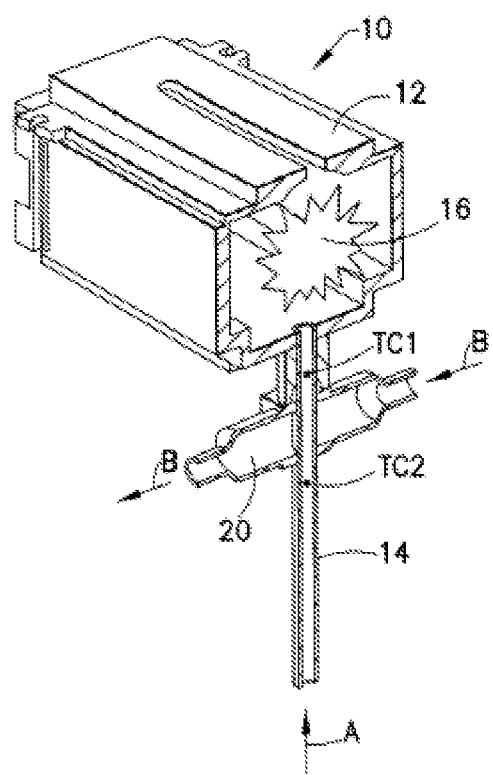
FIG. 2 is a cross section of an ion implantation system schematically showing the generation of a plasma in the arc chamber of such system, with the gas feed line being arranged to provide active cooling of such line, as useful for precursors of the present disclosure that are susceptible to decomposition if not thus cooled.

FIG. 2 is a cross section of an ion implantation system schematically showing the generation of a plasma in the arc chamber of such system, with the gas feed line being arranged to provide active cooling of such line, as useful for precursors of the present disclosure that are susceptible to decomposition if not thus cooled.

The ion implantation system 10 includes an arc chamber 12 with a gas feed line 14 for feeding a precursor of the present disclosure to the arc chamber for ionization thereof in the chamber. A plasma 16 is generated in the arc chamber 12 of such system. The precursor gas is flowed in the direction indicated by arrow A into the precursor gas feed line 14, having monitoring thermocouples TC1 and TC2 secured thereto in monitoring relationship to determine the quality of the thermal state of the feed line and gas entering the arc chamber.

In this ion implantation system 10, the precursor gas feed line is adapted for active cooling of such line. Specifically, the precursor gas feed line 14 has associated therewith a coolant passage 20 through which cooling medium flows in the direction indicated by arrows B. The monitoring thermocouples TC1 and TC2 are secured in monitoring relationship to the precursor gas feed line to determine the quality of the thermal state of the feed line and gas entering the arc chamber.

The coolant passage may be configured as a cooling jacket on the precursor gas feed line, or may include passages circumscribing or interdigitated with the precursor gas feed line, or include other heat exchange or coolant elements, arrays or assemblies effective to provide cooling to the precursor gas so that decomposition and deposition of clogging solid by-products in the gas feed line and in the arc chamber are avoided.

It will be appreciated that the cooling arrangement of the precursor gas feed flow can be implemented and operated in any suitable manner to effect the requisite cooling of the precursor gas, and the cooling arrangement may further be integrated with a thermal management control system for the ion source, so that the flow rate of the coolant and other operating parameters are appropriately set for effective ion implantation with precursor gases that would otherwise be unsuitable for ion implantation usage. Such cooling arrangement can be utilized with ion implantation systems of widely varied type, utilizing correspondingly varied precursor gases of the present disclosure.

Figure 3:
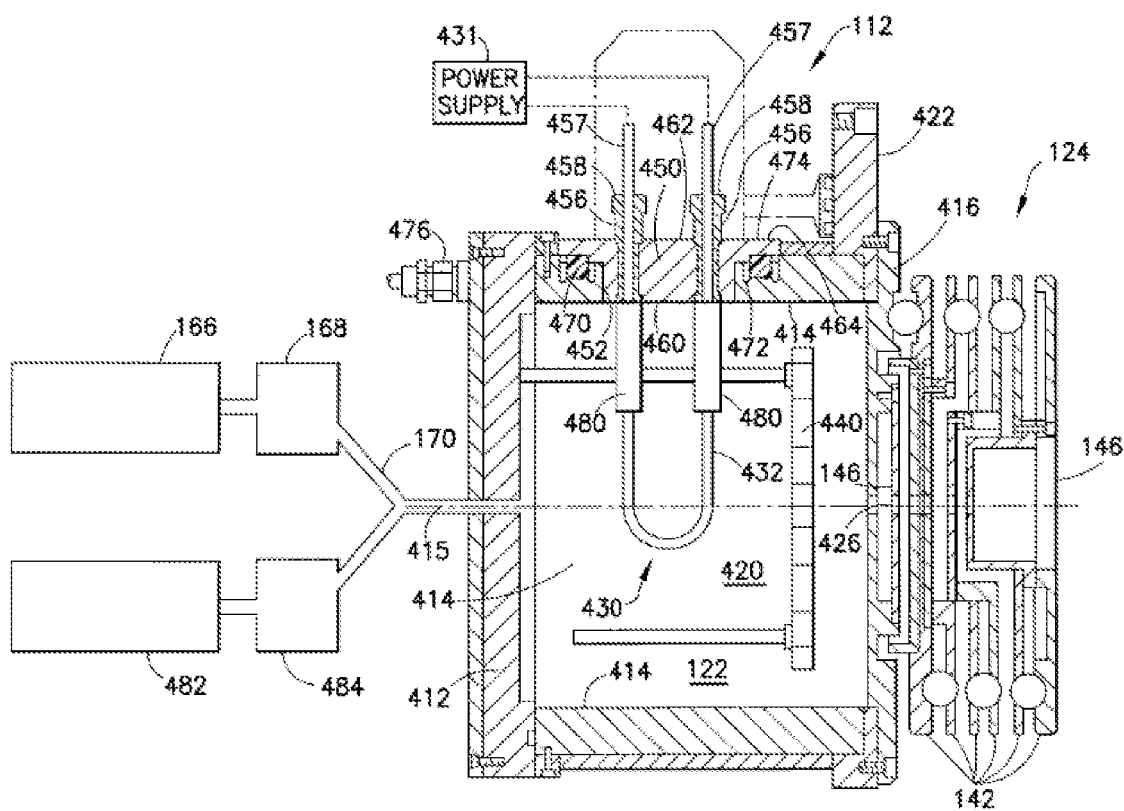
FIG. 3 is a cross-sectional view of an ion source of an ion implantation system arranged for co-flow supply of gases thereto, according to one embodiment of the present disclosure.

FIG. 3 is a cross-sectional view of an ion source of an ion implantation system arranged for co-flow supply of gases thereto, according to one embodiment of the present disclosure. The ion source 112 comprises a housing which defines a plasma chamber 122, and an ion extractor assembly. Energy is imparted to the ionizable precursor gas to generate ions within the plasma chamber 122. Generally, positive ions are generated, although the present disclosure is applicable to systems wherein negative ions are generated by the precursor gas. The positive ions are extracted through a slit in the plasma chamber 122 by the ion extractor assembly 124, which comprises a plurality of electrodes 142. Thus, the ion extractor assembly functions to extract a beam of positive ions from the plasma chamber through an extraction aperture plate 146 and to accelerate the extracted ions toward a mass analysis magnet (not shown in FIG. 3).

Ionizable precursor gas is flowed from a source 166 of ionizable precursor gas and is injected into the plasma chamber 122 through conduit 170 containing mass flow controller 168 therein. The source 166 may include a sorbent-based gas storage and supply vessel, e.g., of a type as commercially available from Entegris, Inc. (Billerica, Mass., USA) under the trademark SDS, a pressure-regulated vessel including an internal gas pressure regulator, e.g., of a type commercially available from Entegris, Inc. (Billerica, Mass., USA) under the trademark VAC, or, when a solid dopant source material is employed, the source 166 may include a solid source vessel, e.g., of a type as commercially available from Entegris, Inc. (Billerica, Mass., USA) under the trademark ProE-Vap. The plasma chamber 122 has electrically conductive chamber walls 412, 414, 416 that bound an ionization zone 420 in the chamber interior. Side wall 414 is circularly symmetric about a center axis 415 of the plasma chamber 122. A conductive wall 416 that faces a resolving magnet is connected to a plasma chamber support 422. Wall 416 supports the aperture plate 146 having multiple openings that allow ions to exit the plasma chamber 122 and then combine to form the ion beam at a location downstream from multiple spaced apart and electrically isolated extraction electrodes 124. The aperture plate 146 includes a number of openings arranged in a specified pattern that align with similarly configured multiple apertures in the spaced-apart extraction electrodes 142. Only one such aperture is shown in FIG. 3.

A metallic antenna 430 has a metal surface 432 exposed within the chamber interior for emitting energy into the plasma chamber 122. A power supply 434 outside the plasma chamber 122 energizes the metallic antenna 430 with a radio frequency (RF) signal of suitable character, e.g., an RF signal of approximately 13.56 megahertz (MHz), to set up an alternating electric current in the metallic antenna to induce an ionizing electric field within the plasma chamber 122. The power of the antenna may be of any suitable magnitude suitable for the specific ionization operation, e.g., a power on the order of 500-3000 watts (W). The pressure in the source chamber can for example be on the order of 1-10 millitorr, so that the source 112 functions as a low pressure, high-density inductive source. The plasma chamber 122 may also include a magnetic filter assembly 440 extending through a region of the chamber interior between the antenna 430 and the aperture plate 146.

The antenna 430 can be positioned within the plasma chamber 122 by a removable support plate 450. The support plate 450 is supported by the side wall 414 at a location having a circular cutout 452 through which the antenna extends. A support plate 450 for the antenna 430 is sized to fit within the cutout 452 in the chamber wall 414 while positioning the exposed U-shaped metal portion 432 of the antenna 430 within the ionization zone 420.

The support plate 450 defines two through passageways that accommodate two vacuum pressure fittings 456. After elongated leg segments 457 of the antenna 430 are pushed through the fittings, end caps 458 are screwed onto the fittings to seal the region of contact between the fittings 456 and the leg segments 457. The antenna 430 is preferably U-shaped in its radiation-emitting region and may for example be constructed from aluminum. The tube has an outer diameter dimensioned to pass through the pressure fittings 456. While in use the antenna absorbs the heat from its surroundings. To dissipate this heat a coolant is routed through the center of the tube.

The plate 450 has a generally planar surface 460 that is exposed to an interior of the plasma chamber and includes a parallel outer surface 462 that faces away from the chamber interior. A flanged portion 464 of the plate 450 overlies a ring magnet 470 that surrounds the cutout in the wall 414 and that is attached to the wall 414 by connectors 472. A ferromagnetic insert 474 attached to the support plate 450 fits over the magnet 470 so that as the plate 450 is positioned within the cutout 452, the ferromagnetic insert 474 and the magnet 470 attract each other to secure the plate 450 in position with the antenna 430 extending into the chamber interior.

During operation of the ion source, heat is generated and this heat is absorbed by the walls 412, 414, 416, 418. The absorbed heat can be removed from the chamber 122 by a coolant that is introduced through a fitting 476 for routing water into a passageway through the walls and away from the chamber by a second exit fitting (not shown). By this arrangement, the temperature of the walls may be maintained at temperature below 100° C., so that the ion source 112 functions as a cold walled ion source.

A region of the antenna 430 near the support plate 450 is particularly susceptible to coating with sputtered material during operation of the ion implanter. To minimize the effect of such sputtering, two shields 480 can be slipped over the aluminum antenna before the antenna is inserted into the support plate 450. These shields are preferably constructed from aluminum and are maintained in place by a friction fit between the shields and the outer surface of the exposed aluminum of the antenna 430.

During operation of the ion source 112, deposits of dopant elements may form on the interior walls 412, 414 and 416 that bound the ionization zone 420. The present disclosure contemplates flowing a co-flow gas simultaneously with the source gas while the ion source 112 is operated under normal operating conditions. A co-flow gas source 482 and a corresponding mass flow controller 484 may be provided, with the co-flow gas output of the mass flow controller 484 being combined with the precursor gas output of the mass flow controller 168 in conduit 170 prior to being delivered to the plasma chamber 122. Alternatively, the precursor gas and the co-flow gas may be delivered separately to the plasma chamber.

It will be recognized that the precursor gas source 166 may contain the precursor gas in pre-mixture or combination with other materials, e.g., cleaning materials, diluents, reaction suppressors, equilibrium-directing materials, reactants, coolants, etc. Alternatively, the co-flow gas source 482 may contain the co-flow gas or gases in mixture or combination with cleaning materials, diluents, reaction suppressors, equilibrium-directing materials, reactants, coolants, etc. Any such supplemental materials may be supplied to the ion source and/or associated flow circuitry, using any suitable arrangement of source vessels and/or other supply equipment components.

Thus, co-flow gas(es) can be supplied from a same or a different source vessel in relation to the source vessel supplying the precursor gas, for co-flow of the precursor gas and co-flow gas to the ion source chamber.

The co-flow gas may serve to modulate unwanted deposition in the ion source chamber, by suppressing reactions that would cause such deposition, or may include cleaning gas to effect cleaning in situ of the ion source chamber. Various cleaning gases may be employed for such purpose, including, without limitation, reactive fluorides such as $XeF_2$ and $NF_3$.

Relative flow rates of the co-flow and precursor gas vapors are advantageously determined by empirical or other techniques, within the skill of the art, based on the disclosure herein, to establish suitable co-flow conditions for the respective co-flow gas streams.

While the disclosure has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A gas mixture for ion implantation of silicon and/or silicon ions, consisting of silicon tetrafluoride and hydrogen, wherein the amount of hydrogen in the gas mixture is between 0.01% to 30% by volume, based on total volume of silicon tetrafluoride and hydrogen.

2. The gas mixture of claim 1, wherein the amount of hydrogen in the gas mixture is between 2% to 20% by volume, based on total volume of silicon tetrafluoride and hydrogen.

3. The gas mixture of claim 1, as provided in a gas supply vessel.

4. The gas mixture of claim 1, wherein the silicon tetrafluoride is isotopically enriched above natural abundance in at least one isotope of silicon.

5. A method of implanting silicon and/or silicon ions in a substrate, comprising ionizing silicon tetrafluoride in a gas mixture consisting of silicon tetrafluoride and hydrogen, and implanting silicon and/or silicon ions from said ionizing in the substrate, wherein the amount of hydrogen in the gas mixture is between 0.01% to 30% by volume, based on total volume of silicon tetrafluoride and hydrogen.

6. The method of claim 5, wherein the amount of hydrogen in the gas mixture is between 2% to 20% by volume, based on total volume of silicon tetrafluoride and hydrogen.

7. The method of claim 5, wherein the silicon tetrafluoride is isotopically enriched above natural abundance in at least one isotope of silicon.

\* \* \* \* \*